(12) United States Patent
Griswold et al.

(10) Patent No.: US 9,417,306 B2
(45) Date of Patent: Aug. 16, 2016

(54) MAGNETIC RESONANCE TRAJECTORY CORRECTING WITH GRAPPA OPERATOR GRIDDING

(75) Inventors: Mark Griswold, Shaker Hts., OH (US); Nicole Seiberlich, Shaker Hts., OH (US); Anagha Deshmane, Cleveland Hts., OH (US)

(73) Assignee: Case Western Reserve University, Cleveland, OH (US)

( * ) Notice: Subject to any disclaimer, the term of this patent is extended or adjusted under 35 U.S.C. 154(b) by 1033 days.

(21) Appl. No.: 13/445,058

(22) Filed: Apr. 12, 2012

(65) Prior Publication Data

US 2013/0271137 A1  Oct. 17, 2013

(51) Int. Cl.
*G01R 33/561* (2006.01)
*G01R 33/48* (2006.01)

(52) U.S. Cl.
CPC ........ *G01R 33/5611* (2013.01); *G01R 33/4818* (2013.01); *G01R 33/4824* (2013.01)

(58) Field of Classification Search
USPC .......................... 324/300–322; 600/407–435; 382/128–131
See application file for complete search history.

(56) References Cited

U.S. PATENT DOCUMENTS

| | | | | |
|---|---|---|---|---|
| 8,542,012 B2 * | 9/2013 | Griswold | ........... | G01R 33/4824 324/307 |
| 2011/0089946 A1 * | 4/2011 | Griswold | ........... | G01R 33/4824 324/309 |
| 2011/0093233 A1 * | 4/2011 | Griswold | ........... | G01R 33/4824 702/106 |
| 2012/0002858 A1 * | 1/2012 | Huang | ............... | G01R 33/5611 382/131 |
| 2013/0088225 A1 * | 4/2013 | Weller | ............... | G01R 33/5611 324/307 |
| 2013/0207652 A1 * | 8/2013 | Weller | ............... | G01R 33/5611 324/309 |
| 2013/0271137 A1 * | 10/2013 | Griswold et al. | ............. | 324/314 |
| 2015/0346300 A1 * | 12/2015 | Setsompop | ........ | G01R 33/4828 324/309 |
| 2015/0374237 A1 * | 12/2015 | Hu | ......................... | A61B 5/055 600/413 |
| 2016/0104279 A1 * | 4/2016 | Li | ......................... | G06T 7/0012 382/131 |

OTHER PUBLICATIONS

Peters et al. (2003), Centering the projection reconstruction trajectory: Reducing gradient delay errors. Magnetic Resonance in Medicine, 50: 1-6.
Larson et al. (2004), Self-gated cardiac cine MRI. Magnetic Resonance in Medicine, 51: 93-102.
Seiberlich et al. (2008), Self-calibrating GRAPPA operator gridding for radial and spiral trajectories. Magnetic Resonance in Medicine, 59: 930-935.

* cited by examiner

*Primary Examiner* — Melissa Koval
*Assistant Examiner* — Tiffany Fetzner
(74) *Attorney, Agent, or Firm* — Quarles & Brady LLP

(57) ABSTRACT

Apparatus, methods, and other embodiments associated with magnetic resonance (MR) trajectory correcting using GRAPPA operator gridding (GROG) are described. One example method includes identifying an on angle or regular portion of a projection in an MR trajectory and then computing base GROG weights for that portion. The example method includes identifying a shift direction and a shift amount for the projection. The shift direction is configured to shift the projection towards a desired point in k-space and the shift amount is configured to shift the projection by a desired amount in the shift direction. With a shift direction and amount available, the example method corrects for a gradient delay by manipulating the MR source signal data using the shift direction and the shift amount. In one embodiment, a gradient delay can be determined and used to calibrate an MRI apparatus.

11 Claims, 11 Drawing Sheets

MAGNETIC RESONANCE TRAJECTORY CORRECTING WITH GRAPPA OPERATOR GRIDDING

BACKGROUND

Generalized Auto-calibrating Partially Parallel Acquisitions (GRAPPA) is described in Griswold, et al., Proceedings of the ISMRM, Vol. 7, Issue 6, Pg. 1202-1210 (2002). GRAPPA facilitates generating uncombined coil images for coils in an array of receive coils used by a parallel magnetic resonance imaging (pMRI) apparatus. GRAPPA reconstructs missing lines in coil elements by forming linear combinations of neighboring lines to reconstruct individual missing data points. The weights for these linear combinations are derived by forming a fit between additionally acquired lines using a pseudo-inverse operation.

GRAPPA Operator Gridding (GROG) is described in Seiberlich, et al., Non-Cartesian data reconstruction using GRAPPA operator gridding (GROG), Magn Reson Med. 2007 December; 58(6): 1257-65. GROG facilitates gridding data sampled along a non-Cartesian trajectory. GROG facilitates shifting acquired data points to another (e.g., nearest) Cartesian location to facilitate converting non-Cartesian to Cartesian data. GROG synthesizes the net weight for a shift from a basis set of weights along logical k-space directions. GROG employs local averaging because the reconstructed points fall upon the Cartesian grid. This facilitates not having to calculate and apply a density compensation function (DCF).

Magnetic resonance imaging (MRI) pulse sequences manipulate gradient fields by controlling gradient coils. Gradient coils are physical things that have physical properties including, for example, a delay time and a slew rate. The delay time describes how quickly a gradient coil may respond to a direction to change the state of the gradient coil. The slew rate describes the rate of ascent or descent of a gradient from zero to its maximum amplitude once it has begun to respond to the direction to change its state. Having a faster slew rate allows the gradient to slew from zero to its maximum amplitude in less time, which in turn facilitates having faster gradients and shorter echo spacing. Unfortunately, different gradient coils may have different delay times and may have different slew rates, which may introduce artifacts into magnetic resonance images.

FIG. 1 illustrates a square wave 100 and a non-square wave 110. Square wave 100 and non-square wave 110 represent the amplitude of a gradient field being produced by a gradient coil. In theory a gradient coil would respond instantaneously to produce a gradient field whose amplitude would then transition like square wave 100. In practice, due to slew rate, a gradient coil responds less than instantaneously and produces a gradient field whose amplitude transitions more like wave 110.

FIG. 2 illustrates a non-square wave 200 that represents the amplitude of a gradient field produced by a gradient coil. Non-square wave 200 illustrates the effect of both slew rate and delay. For example, a gradient coil may receive an input at time T20 that is intended to cause the gradient coil to change its state. However, the gradient coil may not begin to slew until time T21. The delay may be caused, for example, by switching, by a capacitor charging, or by other factors. Once the gradient coil begins to slew at T21, the gradient field amplitude continues to change until time T22 where the gradient field amplitude achieves steady state. At a later time T23 the gradient coil may slew in the other direction until the gradient field returns to its original state at time T24.

MRI pulse sequences may manipulate multiple gradients at the same time. Thus, the situation illustrated in FIG. 3 could occur. FIG. 3 illustrates the amplitude of a gradient field 300 transitioning as controlled by a gradient coil $G_X$ and the amplitude of a gradient field 310 transitioning as controlled by a gradient coil $G_Y$. While gradient coils $G_X$ and $G_Y$ have similar slew rates, they have different delay times.

Both $G_X$ and $G_Y$ may be controlled to change their state at time T30. $G_X$ may begin to respond at time T31 while $G_Y$ does not begin to respond until time T32. $G_X$ achieves steady state at time T32 while $G_Y$ does not achieve steady state until T33. Between T33 and T35, both gradient fields are in steady state. A trajectory associated with the two gradient fields $G_X$ and $G_Y$ may be stable during this period of time. Both $G_X$ and $G_Y$ may be controlled at time T34 to change their state. Once again $G_X$ may respond more quickly and begin to change state at T35 while $G_Y$ does not respond until a later time. Eventually both $G_X$ and $G_Y$ achieve their original steady state.

During the period of time 36 between T31 and T32, only the $G_X$ gradient field is active and that field has not yet achieved steady state. During the period of time 37 between T32 and T33, both the $G_X$ and the $G_Y$ gradients are active but the $G_Y$ field has not yet achieved steady state. Thus, a trajectory associated with $G_X$ and $G_Y$ may not be stable during the period of time between T31 and T33. Once $G_X$ and $G_Y$ achieve steady state at T33 the trajectory may be stable during, for example, period of time 38. The situation illustrated in FIG. 3 could be even further complicated if $G_X$ and $G_Y$ also had different slew rates.

FIG. 4 illustrates a radial projection associated with a system where gradient coils reacted identically and without delay. The radial projection includes a portion $400_{OUT}$ that extends directly out from the center of k-space. The radial projection also includes a portion $400_{BACK}$ that returns directly through the center of k-space. Note that the projection angle θ is the same for both $400_{OUT}$ and $400_{BACK}$.

FIG. 5 also illustrates a radial projection. But in FIG. 5 the radial projection is associated with a system where gradient coils did not react identically and did not react instantaneously. The radial projection includes a portion $500_{OUT}$ that extends out from a position offset from the center of k-space. The radial projection also includes a portion $500_{BACK}$ that returns but not directly through the center of k-space. Once again note that the projection angle is the same for both $500_{OUT}$ and $500_{BACK}$.

FIG. 6 illustrates a trajectory that would be experienced by the radial projection that includes $500_{OUT}$ and $500_{BACK}$. Once the gradients reach steady state, the projection is stable and lies along the desired projection angle. However, the projection does not originate from the center of k-space nor does it pass back through the center of k-space. This may lead to artifacts in an image reconstructed from the radial projection.

FIGS. 5 and 6 illustrate how gradient delays and stewing can cause a trajectory desired by a pulse sequence to not be exactly where it was intended to be. The trajectory may proceed at the correct angle during an "on angle" portion, but it may not pass through desired points (e.g., center of k-space). Ideally, a projection would go out and back passing through the same points. In FIG. 6, since the X gradient reacts more quickly than the Y gradient, the projection first gets shifted to the right in the X direction and then gets shifted to the left in the X direction. Although neither $500_{OUT}$ nor $500_{BACK}$ are exactly where they are supposed to be, they are still useful because they are on the desired projection angle θ.

To summarize, gradient timing delays may cause mismatches between a desired trajectory and an actual trajectory. In radial scanning, individual projections may be shifted along the direction of the projection or may be translated in k-space so that they do not pass through the center of k-space. These shifts may cause artifacts in reconstructed images. Conventional systems may attempt to address the shifts by measuring the trajectory using a separate acquisition. Making a separate acquisition takes additional time, during which conditions may change. These conventional approaches assume that shifts are consistent between measurements. However, the assumption may not hold due to gradient coupling, patient motion, or other factors. Even if the assumption holds during the additional acquisition, the conventional approaches may still only provide a partial solution. The extra measurement may not address k-space signals that are being used for additional purposes including, for example, self-gating signals acquired from repeatedly sampling the echo peak.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example apparatus and methods account for trajectory shifts caused by gradient delays in magnetic resonance imaging (MRI). Accounting for the trajectory shifts may include correcting for trajectory errors, determining a location for the center of k-space, and other actions. Unlike conventional systems, example apparatus and methods do not employ an additional acquisition to account for trajectory shifts.

Figure 5:
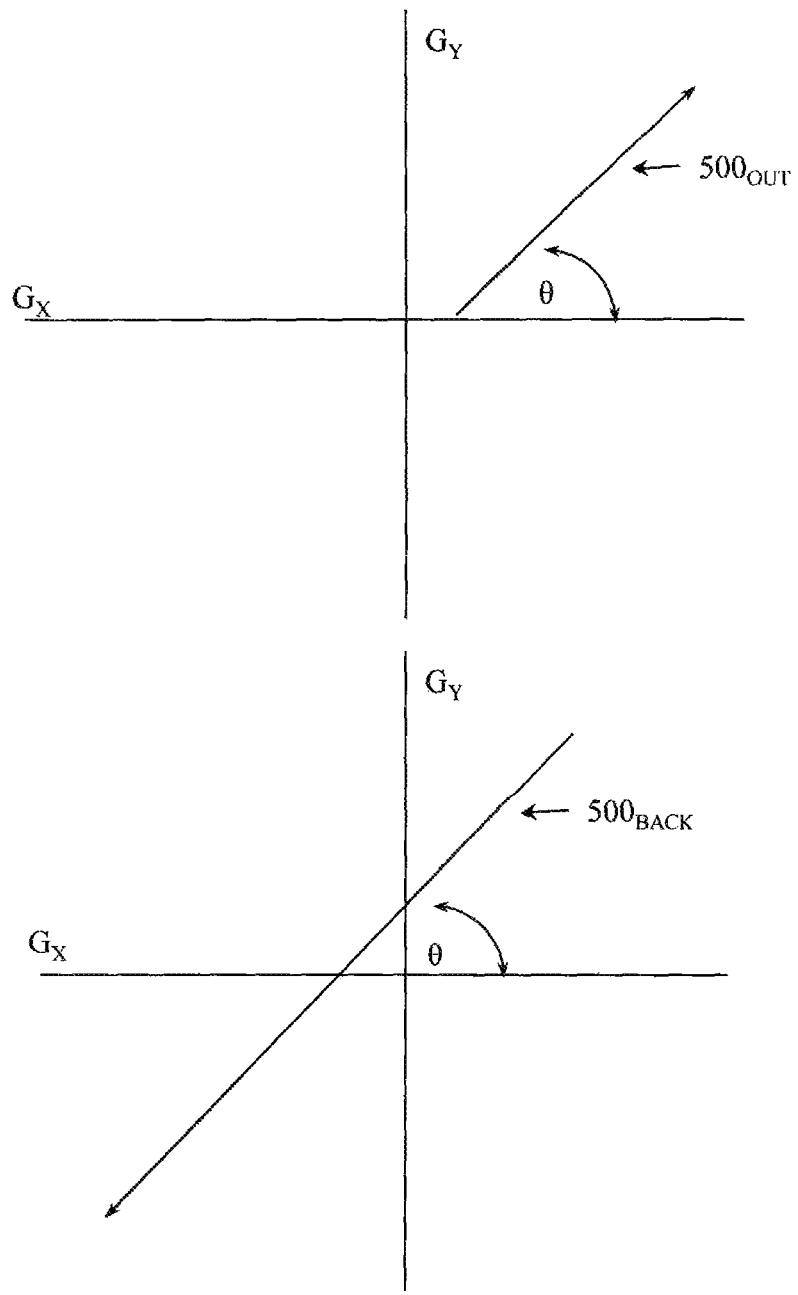
FIG. 5 illustrates a radial projection.
Figure 6:
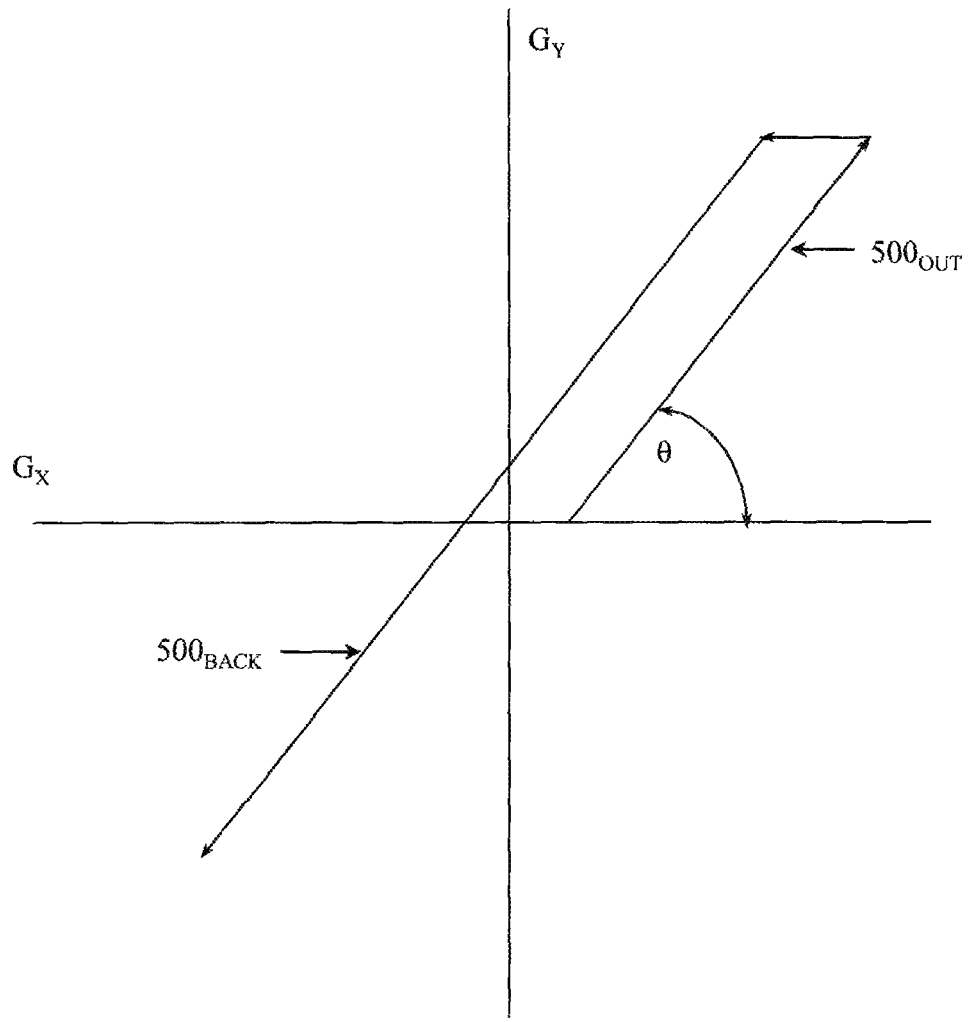
FIG. 6 illustrates a shifted radial projection.

Example apparatus and methods may rely on GRAPPA Operator Gridding (GROG) to provide base weights for use in shifting a trajectory. Consider FIG. 5, where the projection angle θ of the shifted projection will be correct during portions of the trajectory. Gradient delays may shift the projection so that it is off center. GROG may facilitate shifting the projection back to on center. Gradient delays may cause a shift either along a projection or perpendicular to the projection and thus some parts at the beginning of the projection may not have the desired projection angle θ. However, once the gradients have achieved their desired gradient amplitude in the steady state, the projection angle θ of the trajectory will be correct and the projection may be linear or substantially linear.

Because the projection angle θ will be correct and consistent for a portion of a trajectory, and because the projection will be linear or substantially linear, GROG base weights can be determined for the portion for which the projection angle θ is correct and consistent. These GROG base weights can then be used to selectively shift a trajectory. The GROG base weights can also be used to facilitate finding the center of k-space relative to the k-space points sampled by the shifted trajectory. After the center of k-space is located, the trajectory can be shifted by an appropriate amount and in an appropriate direction so that it will pass through a desired location (e.g., center of k-space).

Example apparatus and methods may also determine gradient delays. If consistent gradient delays can be established for an operating MRI apparatus, then the MRI apparatus may be calibrated. The calibrating may include, for example, adapting pulse sequences for that particular MRI apparatus to reduce the period of time where gradients are not working as desired. For example, if a $G_Y$ coil is found to consistently react more slowly than a $G_X$ coil, then a pulse sequence for that particular machine may be altered to account for the discrepancy.

Figure 7:
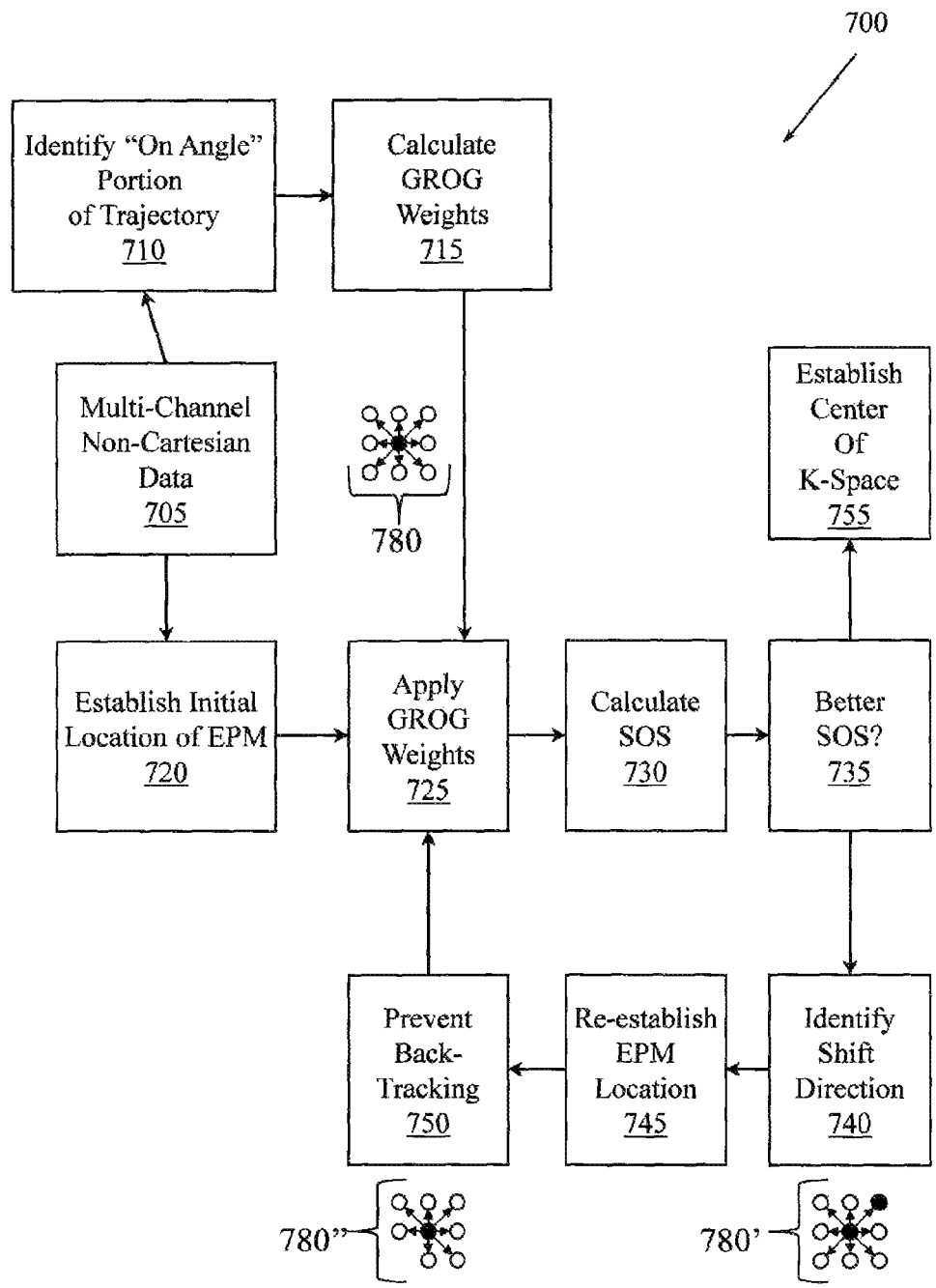
FIG. 7 illustrates an example data flow associated with MR trajectory mapping.

FIG. 7 illustrates one example data flow 700 associated with MR trajectory mapping using GROG. The data flow 700 starts with source signals 705. The source signals 705 may be, for example, multi-channel non-Cartesian data. As described above, a projection may have an on angle portion and an off angle portion. Therefore data flow 700 includes, at 710, identifying an on angle portion of a trajectory. GROG weights 715 are then calculated for points in this on angle portion. Data flow 700 also includes, at 720, establishing an initial location for a supposed center of k-space. In one embodiment, the initial/supposed center of k-space is selected as the point having the maximum measured echo-peak magnitude (EPM). With a set of GROG weights available, and with an initial guess for the center of k-space available, data flow 700 may proceed to apply GROG weights at 725 to produce a new candidate set of points 780. The candidate set of points 780 will be shifted by a fractional GROG weight (e.g., 0.1Δk, 0.25Δk) in various directions. While 8 directions are illustrated, a greater or lesser number of directions may employed. Additionally, while the 8 directions are uniformly distributed around a compass, non-uniform distributions may employed.

Having prepared candidate points 780, data flow 700 then proceeds, at 730, to evaluate those candidate points 780 to determine whether there is a new best guess for the center of k-space. Evaluating the candidate points 780 may include, at 730, calculating characterizing values for the candidate points 780 and retrieving information from those characterizing values at 735. In one example, the characterizing values may be computed using a sum-of-squares (SoS) approach where SoS are computed for candidate points 780 across different, and potentially all, available data channels. The evaluation at 735 may analyze whether a computed SoS indicates that one point in the candidate points 780 is better than another and better than those seen so far (e.g., current estimate of center of k-space). If the answer at 735 is no, then the presumed center of k-space has been identified and that presumed center can be established as "the center of k-space" at 755. If the answer at 735 is yes, then further action may be undertaken.

For example, at 740 a determination may be made concerning a shift direction indicated by the superior SoS information. The shift direction is indicated in candidate points 780' as being up and to the right. This shift direction may then be employed at 745 to re-establish the guess for the center of k-space associated with the echo-peak maximum (EPM). In an iterative process it may not make sense to allow the process to backtrack. Therefore data flow 700 may include, at 750, removing some shift directions or future candidate points from consideration. Candidate points 780" illustrate removing the point down and to the left since that is the point from which the candidate points 780' were shifted.

Data flow 700 may then continue until a best guess for the center of k-space is identified. In one example, data flow 700 may be associated with an iterative gradient ascent approach. Other approaches may be employed.

Some portions of the detailed descriptions that follow are presented in terms of algorithms and symbolic representations of operations on data bits within a memory. These algorithmic descriptions and representations are used by those skilled in the art to convey the substance of their work to others. An algorithm is considered to be a sequence of operations that produce a result. The operations may include creating and manipulating physical quantities that may take the form of electronic values. Creating or manipulating a physical quantity in the form of an electronic value produces a concrete, tangible, useful, real-world result.

It has proven convenient at times, principally for reasons of common usage, to refer to these signals as bits, values, elements, symbols, characters, terms, and numbers. It should be borne in mind, however, that these and similar terms are to be associated with the appropriate physical quantities and are merely convenient labels applied to these quantities. Unless specifically stated otherwise, it is appreciated that throughout the description, terms including processing, computing, and determining, refer to actions and processes of a computer system, logic, processor, or similar electronic device that manipulates and transforms data represented as physical quantities (e.g., electronic values).

Example methods may be better appreciated with reference to flow diagrams. For simplicity, the illustrated methodologies are shown and described as a series of blocks. However, the methodologies may not be limited by the order of the blocks because, in some embodiments, the blocks may occur in different orders than shown and described. Moreover, fewer than all the illustrated blocks may be required to implement an example methodology. Blocks may be combined or separated into multiple components. Furthermore, additional or alternative methodologies can employ additional, not illustrated blocks.

Figure 8:
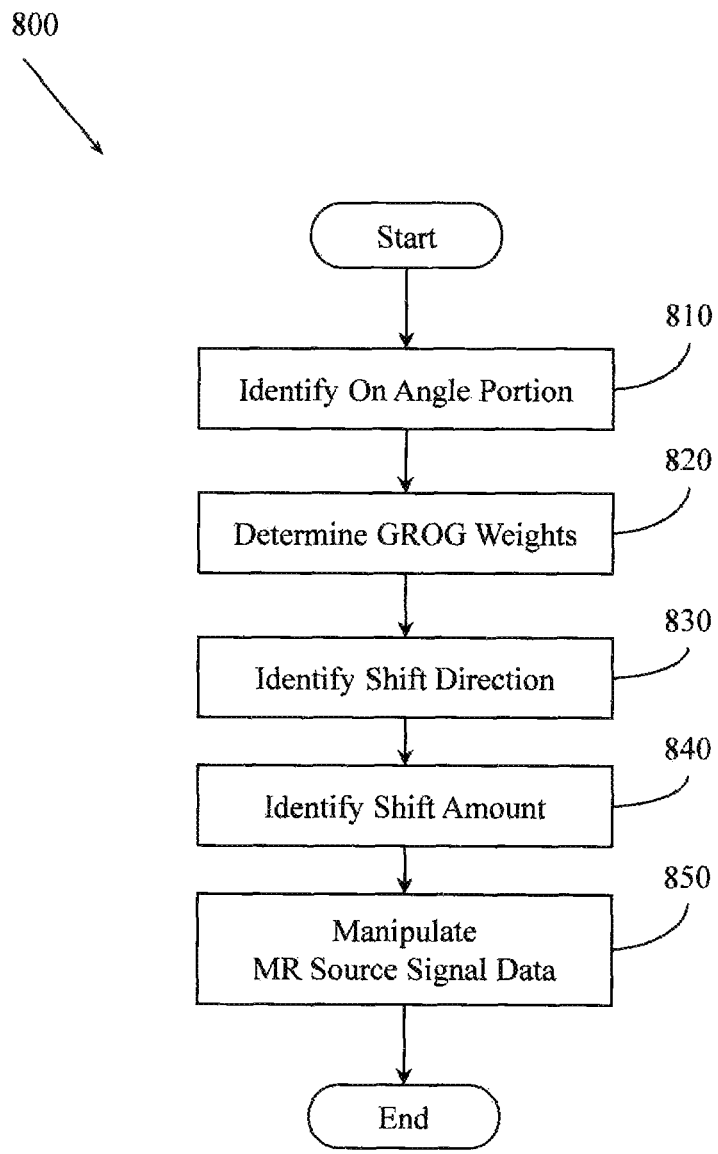
FIG. 8 illustrates an example method associated with MR trajectory mapping.

FIG. 8 illustrates an example method 800 associated with MR trajectory correcting. Method 800 includes, at 810, identifying an on angle portion of a set of MR source signal data associated with a projection in an MR trajectory. In one example, the set of MR source signal data may be multichannel non-Cartesian (e.g., radial) data. In one example, identifying the on angle portion of the set of MR source signal data includes identifying where the linearity of the projection meets a linearity threshold or identifying where the projection has a desired projection angle. A projection that initially wanders off course while gradients are delayed may become sufficiently regular (e.g., linear) or may maintain a desired projection angle after the gradients achieve steady state.

Method 800 also includes, at 820, determining a set of base GROG weights for the on angle portion.

Method 800 also includes, at 830, identifying a shift direction for the projection. Computing the shift direction facilitates shifting the projection towards a desired point in k-space. The final shift direction may be computed by traversing a path from a starting point to an ending point. Thus, in one example, identifying the shift direction includes determining an initial estimate for the center of k-space and then iteratively examining other possible estimates for the center of k-space using a travelling approach (e.g., gradient ascent). While a travelling approach (e.g., gradient ascent) is described, in one embodiment a large number of candidate points in a finite data space could be examined collectively in one pass. In one example, determining the estimate for the center of k-space comprises determining a measured echo-peak magnitude (EPM) for the set of MR source signal data.

Examining the other possible estimates may include first generating a set of candidate points from the on angle portion of the set of MR source signal data so there is something to which the initial estimate can be compared. In one example, generating the set of candidate points may include creating N different candidate points in N different locations in k-space. The N different locations may be determined by shifting a point in the on angle portion of the set of MR source signal data along a set of N candidate shift directions by a fractional amount of the base GROG weights. N may be, for example, 2, 4, 8, 16, 32, or other integer values. The fractional amount may be, for example, $0.1\Delta k$, $0.25\Delta k$, or other amounts.

Once the candidate points are available for comparison, an instant or local shift direction can be selected for a step along a path based, at least in part, on re-determining the estimate for the center of k-space using the set of candidate points. In one example, re-determining the estimate for the center of k-space includes computing a sum of squares value for a member of the set of candidate points and then, if the sum of squares value indicates that the member of the set of candidate points is more likely the center of k-space than the estimate for the center of k-space, making the member of the set of candidate points the new estimate for the center of k-space. In one example, computing the sum of squares value for the member is based, at least in part, on information associated with multiple different channels associated with acquiring the set of MR source signal data.

After a number of iterations during which a number of instant shift directions are acquired, an overall shift direction may be identified. Thus, in one example, method 800 may include iterating through the determining, generating, and selecting involved in identifying a shift direction under the control of a gradient ascent algorithm. The gradient ascent algorithm termination condition may include determining that the estimate for the center of k-space has not improved between iterations.

Method 800 also includes, at 840, identifying a shift amount for the projection. Computing the shift amount facilitates shifting the projection by a desired amount in the shift direction. In one example, identifying the shift amount includes comparing an initial estimate for the center of k-space and a final estimate for the center of k-space.

Method 800 also includes, at 850, manipulating the set of MR source signal data based, at least in part, on the shift direction and the shift amount. In one example, manipulating the set of MR source signal data comprises shifting the MR source signal data in the shift direction by the shift amount.

Figure 9:
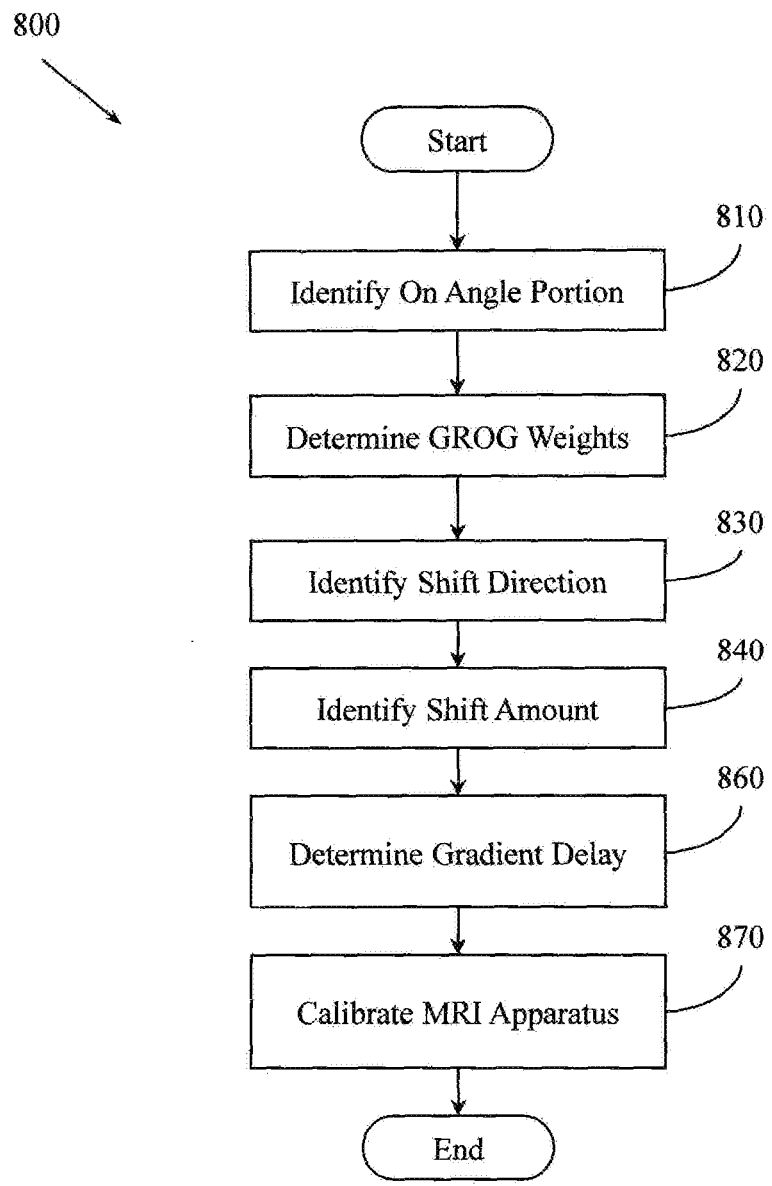
FIG. 9 illustrates an example method associated with MR trajectory mapping.

FIG. 9 illustrates another embodiment of example method 800. This embodiment includes actions 810, 820, 830, and 840, does not include correcting image data, but does include additional calibration and adaptation actions.

This embodiment of method 800 includes, at 860 estimating a gradient delay for a gradient coil associated with an MR apparatus that acquired the set of MR source signal data. In one embodiment, estimating the gradient delay is based, at least in part, on analyzing shift directions or shift amounts determined for two or more projections. The gradient delay may be determined because the amount by which a projection is shifted varies directly with the gradient delay. If a consistent shift amount is found, then there may be a consistent gradient delay.

Figure 1:
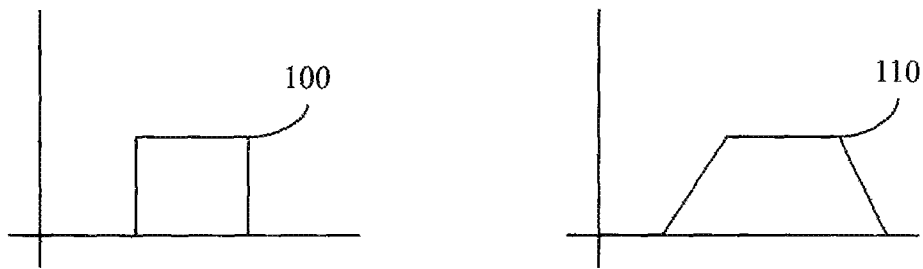
FIG. 1 illustrates two waves representing gradient field amplitude.
Figure 2:
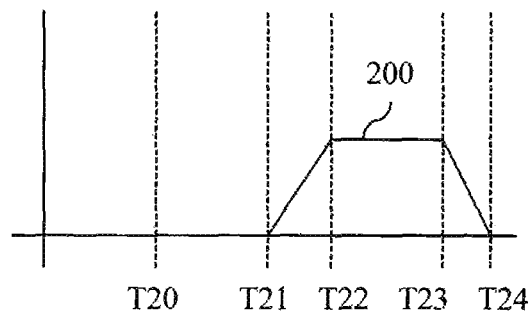
FIG. 2 illustrates an effect of gradient coil slew and delay on gradient field magnitude.
Figure 3:
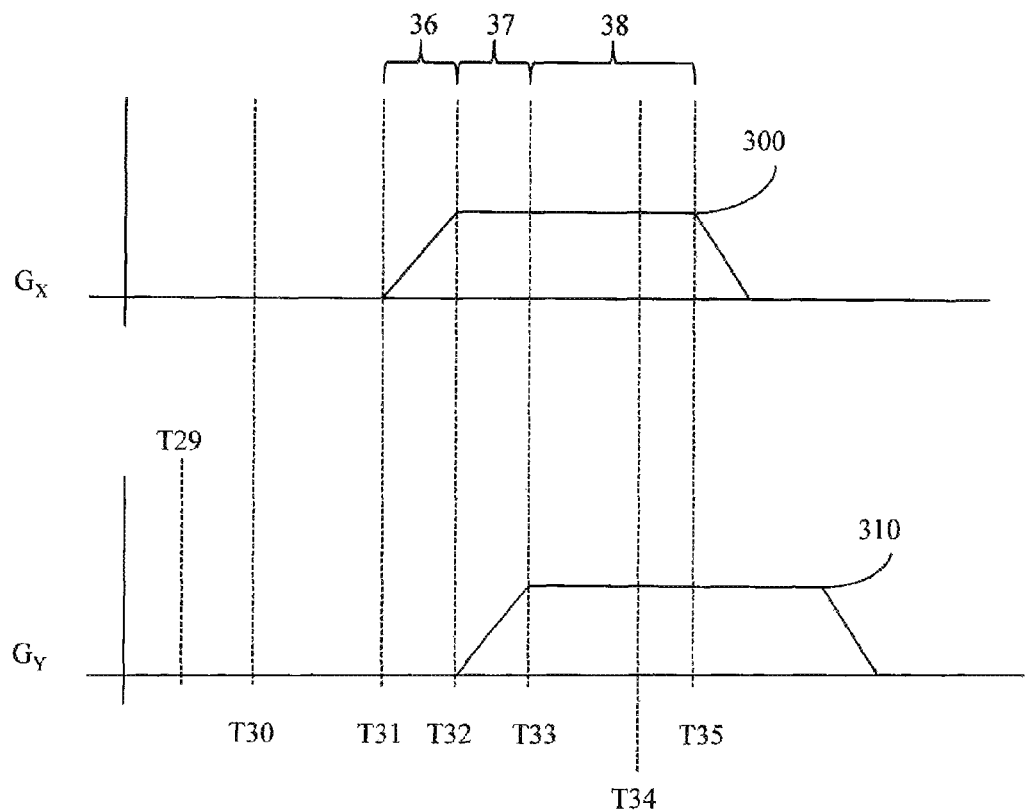
FIG. 3 illustrates an effect of gradient coil slew and delay on gradient field magnitude.
Figure 4:
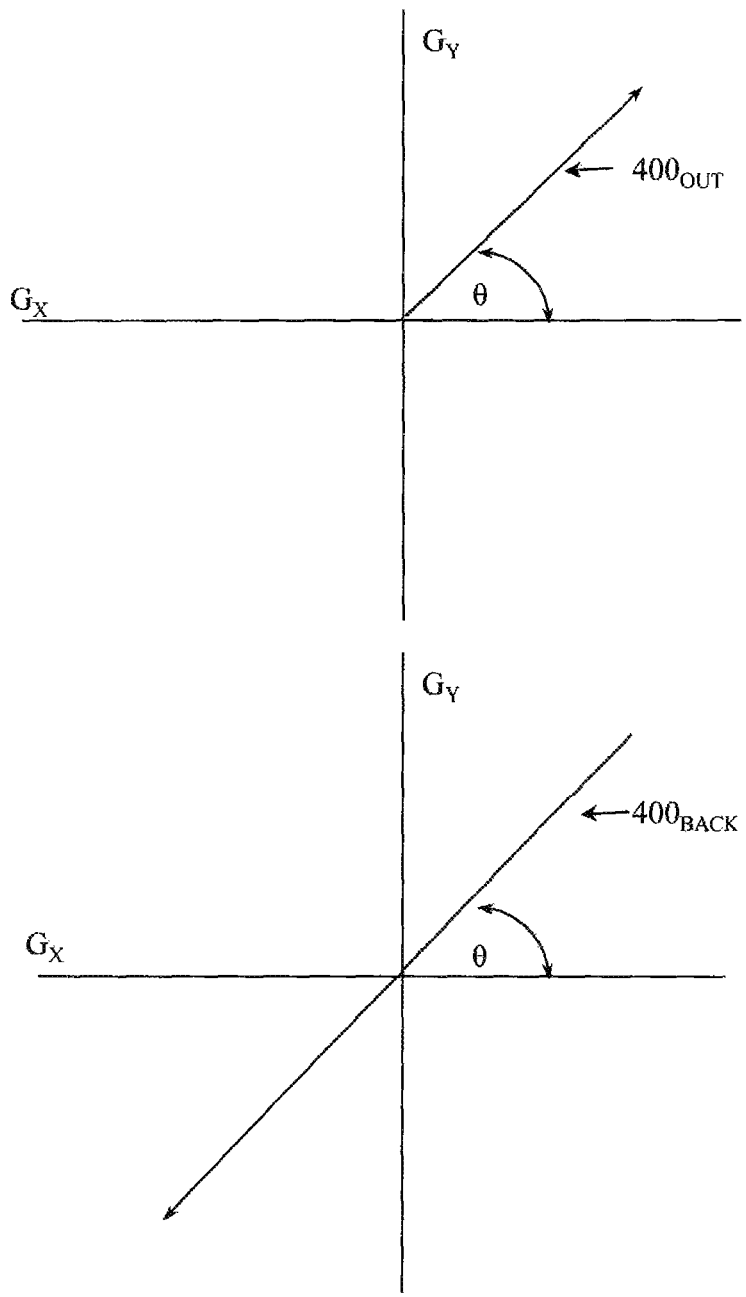
FIG. 4 illustrates a radial projection.

Since a consistent gradient delay may be present, this embodiment of method 800 may also include, at 830, calibrating an MR apparatus based, at least in part, on the gradient delay. Calibrating the MR apparatus can include different actions. In one embodiment, if there is a consistent gradient delay, calibrating the MR apparatus may include manipulating a pulse sequence as a function of the gradient delay. For example, an instruction to control a gradient to change its state may be issued sooner so that the gradient changes state at a desired time. Consider FIG. 3 again. If the $G_Y$ gradient coil is consistently slower to respond than the $G_X$ gradient coil, then the control point for the $G_Y$ gradient coil may be moved to the left of T30 to a point T29 that would allow the $G_Y$ gradient coil to begin to react at T31 instead of at T32. In this way, the gradient coil shifting may be avoided and may not need to be corrected for.

Calibrating the MR apparatus may also include, for example, controlling the MR apparatus to use the estimate of the center of k-space as a portion of a navigator signal for a retrospective self-gated image acquisition.

Figure 10:
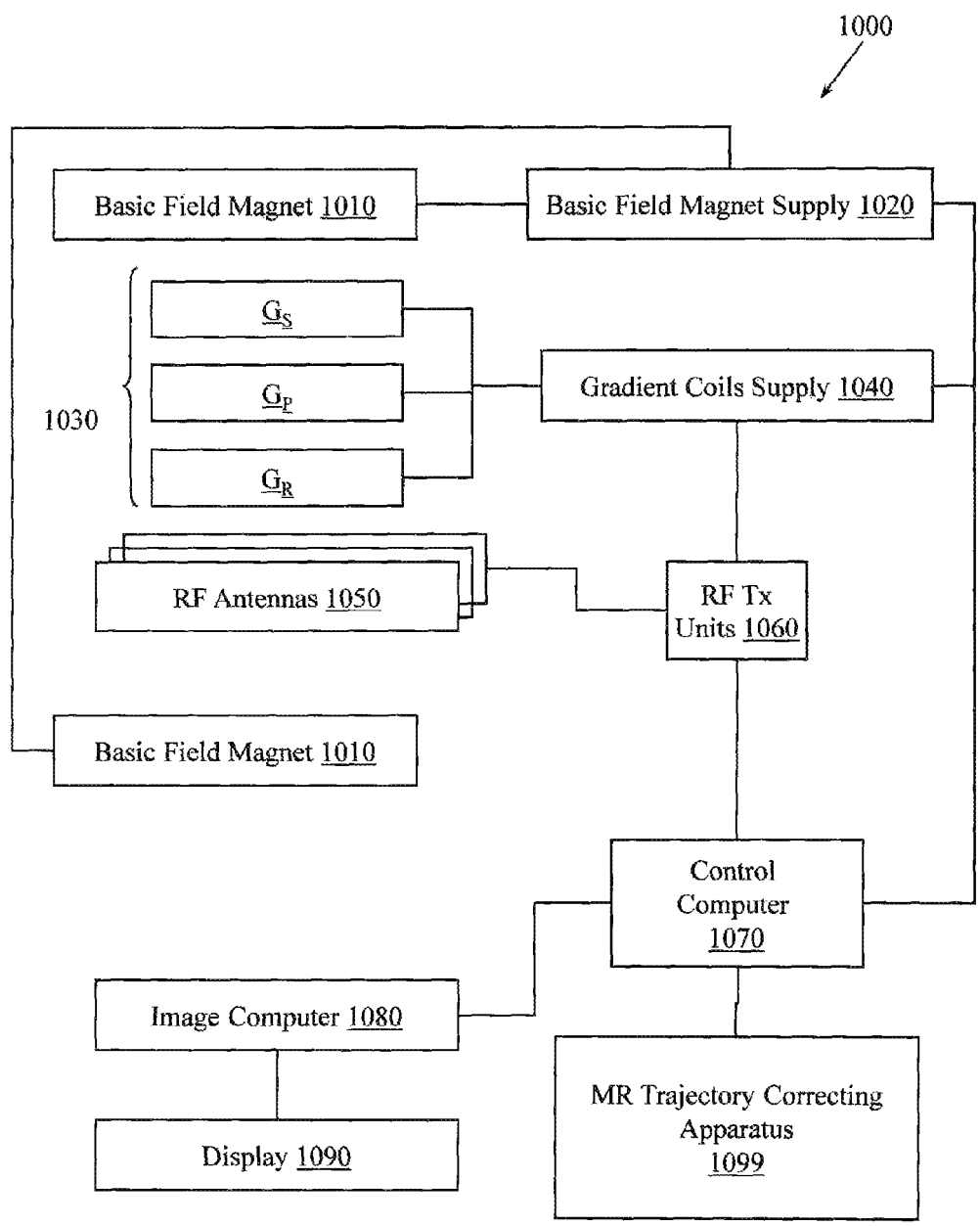
FIG. 10 illustrates an example MRI apparatus configured to perform MR trajectory mapping.

FIG. 10 illustrates an example MRI apparatus 1000 configured with an MR trajectory correcting apparatus 1099. The MR trajectory correcting apparatus 1099 may be configured with elements of example apparatus or circuits described herein or may perform example methods described herein. In one embodiment, apparatus 1099 may provide means for identifying a gradient delay that created an artifact in an image reconstructed from image data acquired during a multi-channel non-Cartesian acquisition by the MRI system 1000. The means may include, for example, circuits, programmed logics, and a special purpose computer. In one embodiment, apparatus 1099 may also include means for correcting the image data to account for the gradient delay using GROG weights calculated from the image data. These means may also include circuits, programmed logics, a special purpose computer, and other apparatus described herein.

The apparatus 1000 includes a basic field magnet(s) 1010 and a basic field magnet supply 1020. Ideally, the basic field magnets 1010 would produce a uniform $B_0$ field. However, in practice, the $B_0$ field may not be uniform, and may vary over an object being imaged by the MRI apparatus 1000. MRI apparatus 1000 may include gradient coils 1030 configured to emit gradient magnetic fields like $G_S$, $G_P$, and $G_R$. The gradient coils 1030 may be controlled, at least in part, by a gradient coils supply 1040. In some examples, the timing, strength, and orientation of the gradient magnetic fields may be controlled, and thus selectively adapted, during an MRI procedure. Ideally the actual gradient magnetic fields produced would perfectly faithfully represent the desired gradient magnetic fields and would be created identically with consistent, matching slew rates, and with consistent, matching delay times. Since these ideals may not be attained, MR trajectory correcting is performed to account for trajectory shifts due, for example, to gradient delays.

MRI apparatus 1000 may include a set of RF antennas 1050 that are configured to generate RF pulses and to receive resulting nuclear magnetic resonance (NMR) signals from an object to which the RF pulses are directed. In one embodiment, the RF antennas 1050 are arranged as an array of parallel transmission coils that are individually controllable. How the pulses are generated and how the resulting MR signals are received may be controlled and thus may be selectively adapted during an MR procedure. Separate RF transmission and reception coils can be employed. The RF antennas 1050 may be controlled, at least in part, by a set of RF transmission units 1060. An RF transmission unit 1060 may provide a signal to an RF antenna 1050. The RF transmission unit 1060 may provide different signals to different RF antennas to produce different RF excitations from the different members of the array of parallel transmission coils.

The gradient coils supply 1040 and the RF transmission units 1060 may be controlled, at least in part, by a control computer 1070. In one example, the control computer 1070 may be programmed to control an NMR device as described herein. Conventionally, the magnetic resonance signals received from the RF antennas 1050 can be employed to generate an image and thus may be subject to a transformation process like a two dimensional Fast Fourier Transform (FFT) that generates pixilated image data. The transformation can be performed by an image computer 1080 or other similar processing device. The image data may then be shown on a display 1090.

Figure 11:
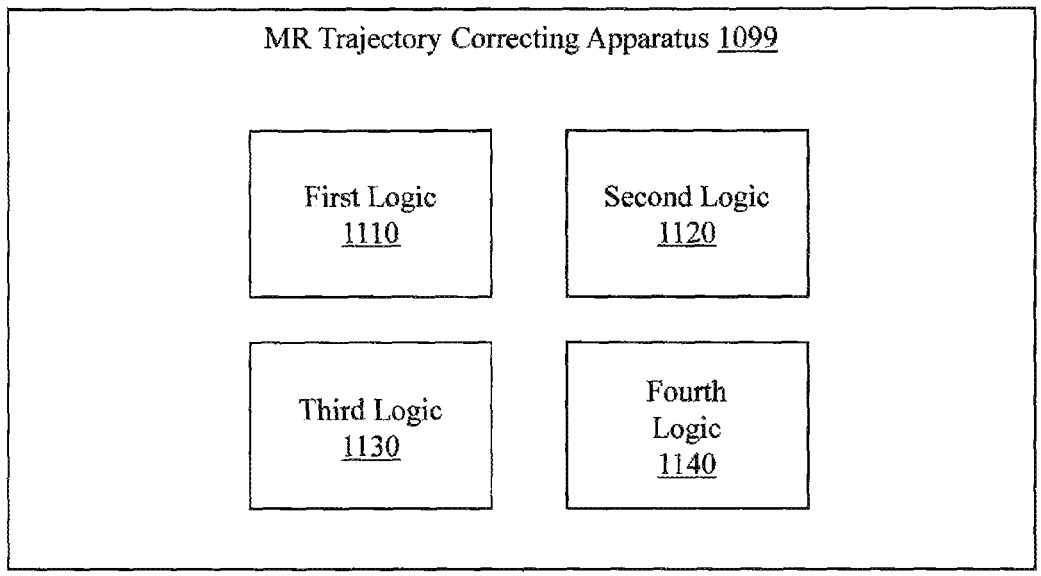
FIG. 11 illustrates an example apparatus associated with MR trajectory mapping.

FIG. 11 illustrates an embodiment of an MR trajectory correcting apparatus 1099. Apparatus 1099 may be a computer, electronic, or other apparatus that is configured to control an MRI apparatus (e.g., apparatus 1000).

Apparatus 1099 may include a first logic 1110 that is configured to access MR trajectory data that has been affected by a gradient delay. The gradient delay may have occurred in an MR apparatus (e.g., apparatus 1000) that acquired the MR trajectory data. Recall that a gradient delay may cause a projection to shift but may leave the projection angle intact. Thus, in one embodiment, the first logic 1110 is also configured to identify a portion of an MR trajectory described by the MR trajectory data that represents an on angle portion of a projection in the MR trajectory. Identifying the on angle portion may include analyzing a projection angle associated with the MR trajectory and determining whether the actual projection angle falls within a threshold amount of a desired projection angle.

In one embodiment, the first logic 1110 is also configured to control the MR apparatus to acquire the MR trajectory data. The MR trajectory data may be acquired, for example, as multi-channel non-Cartesian data.

Apparatus 1099 may include a second logic 1120 that is configured to compute GROG weights for a portion of the MR trajectory data. In one example, the GROG weights may be computed for just the on angle portion of the projection.

Apparatus 1099 may include a third logic 1130 that is configured to compute a shift direction and shift amount for the MR trajectory data. The shift direction and the shift amount may be selected to correct the MR trajectory data. Correcting the MR trajectory data may account for a shift caused, by the gradient delay, which may in turn facilitate mitigating artifacts associated with gradient delays.

In one embodiment, the third logic 1130 is configured to identify the center of k-space by applying an iterative gradient ascent to the MR trajectory data to locate a maximum. While a gradient ascent is described, other point location algorithms may be employed. Gradient ascents and descents begin somewhere and end somewhere and take a series of steps along a path between the beginning point and ending point. Thus, third logic 1130 may be configured to identify a starting point by calculating an initial echo-peak magnitude (EPM) computed in the MR trajectory data. The steps may be taken from a current estimated best point to a member of a set of candidate best points. Third logic 1130 may continue to produce candidate points and to evaluate those candidate points until the gradient ascent terminates. The third logic 1130 may produce candidate gradients points by shifting an actual point in multiple directions by an amount determined by a fractional GROG weight. The third logic 1130 may evaluate candidate points using, for example, a SUM of squares based approach. While a sum of squares based approach is described, one skilled in the art will appreciate that other comparison techniques may be employed.

Once the gradient ascent has terminated and the determined center of k-space has been computed, the third logic 1130 may then compute the shift direction and the shift amount by comparing the determined center of k-space calculated by apparatus 1099 to the initial EPM. In one example, the third logic 1130 may be configured to compute a gradient delay as a function of the shift amount or shift direction.

Apparatus 1099 may include a fourth logic 1140 that is configured to manipulate the MR trajectory to account for the gradient delay. Accounting for the gradient delay may include using the shift amount and the shift direction to manipulate image data to reposition a projection associated with the MR trajectory data. The projection may be repositioned to, for example, pass through a desired point (e.g., the center) in k-space. Thus, the fourth logic 1140 may be configured to manipulate the MR trajectory by applying the shift amount in the shift direction to the MR trajectory data to make the MR trajectory appear to pass through the desired point in k-space.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores signals, instructions or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, or combinations of each to perform a function(s) or an action(s), or to cause a function or action from another logic, method, or system. Logic may include a software controlled microprocessor, a discrete logic (e.g., ASIC), an analog circuit, a digital circuit, a programmed logic device, a memory device containing instructions, and other devices. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"User", as used herein, includes but is not limited to one or more persons, software, computers or other devices, or combinations of these.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, or ABC (e.g., the data store may store only A, only B, only C, A&B, A&C, B&C, or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:
1. A trajectory correcting method that is performed by a computer in a magnetic resonance (MR) apparatus, the method comprising:
   identifying with the computer of the MR apparatus, a portion of a set of MR source signal data associated with on-angle portions of a set of projections in an MR tra- jectory, where the MR source signal data is electronic data that has been acquired by the MR apparatus;

determining with the computer of the MR apparatus, a set of base GROG weights for the on angle portions of the set of projections in an MR trajectory, where the GROG weights are GRAPPA operator gridding (GROG) weights, GRAPPA being a generalized auto-calibrating partially parallel acquisition technique;

identifying a shift direction for an individual projection, from the set of projections in an MR trajectory where the shift direction facilitates shifting the individual projection towards a desired point in k-space;

where identifying the shift direction of an individual projection, from the set of projections in an MR trajectory comprises:

determining, with the computer of the MR apparatus, an estimate of the center of k-space; with the estimate of center of k-space being determined from a measured echo-peak magnitude (EPM) from within the set of MR source signal data that is associated with the on-angle portions, of the set of projections, of an MR trajectory;

generating, a set of candidate points from the on-angle portions of the set of MR source signal data, with the computer of the MR apparatus; and selecting the shift direction based, at least in part, on a re-determining of the estimate of the center of k-space using the set of computer generated candidate points;

identifying a shift amount for the individual projection, with the computer of the MR apparatus by comparing, an initial estimate for the location of center of k-space and a final estimate for the location of the center of k-space; where the shift amount facilitates shifting the individual projection by a desired amount in the shift direction;

manipulating the set of MR source signal data based, at least in part, on the shift direction and the shift amount identified for the individual projection, by shifting the on-angle portions, of the set of projections of the MR source signal data in the identified shift direction, by the identified shift amount and thereby align the set of projections in order to have the individual projection(s) pass through the desired point in k-space;

and reconstructing a magnetic resonance image from the manipulated MR source signal data with the computer of the MRI apparatus.

2. The method performed by the computer in the MR apparatus of claim 1, where the set of MR source signal data comprises multi-channel non-Cartesian data.

3. The method performed by the computer in the MR apparatus of claim 2, where identifying the on angle portion of the set of MR source signal data the comprises;

identifying, with the computer, where the linearity of the individual projection meets a linearity threshold; and identifying, with the computer, where the individual projection also has a desired projection angle.

4. The method performed by the computer in the MR apparatus of claim 1, where generating the set of candidate points comprises creating with the computer of the MR apparatus N different candidate points in N different locations in k-space, where the N different locations are determined by shifting a point in the on angle portion of the set of MR source signal data along a set of N candidate shift directions by a fractional amount of the base GROG weights, with N being an integer.

5. The method performed by the computer in the MR apparatus of claim 4, where re-determining the estimate of the center of k-space comprises:

computing a sum of squares value, for a member of the set of candidate points, with the computer of the MR apparatus; and re-determining the estimate of the center of k-space, upon identifying that the sum of squares value indicates that the member, of the set of candidate points, is more likely the center of k-space than the estimate, of the center of k-space.

6. The method performed by the computer in the MR apparatus of claim 5, where computing the sum of squares value for the member is based, at least in part, on information associated with multiple different channels that are associated with the acquiring of the set of MR source signal data.

7. The method performed by the computer in the MR apparatus of claim 1, comprising with the computer of the MR apparatus iterating through the determining, generating, and selecting steps under the control of a gradient ascent algorithm, where the gradient ascent algorithm termination condition includes determining that the estimate of the center of k-space has not improved between iterations.

8. The method performed by the computer in the MR apparatus of claim 1, comprising with the computer of the MR apparatus estimating a gradient delay of a gradient coil associated with an MR apparatus that acquired the set of MR source signal data, where estimating the gradient delay is based, at least in part, on analyzing the obtained shift directions or the obtained shift amounts that have been determined for two or more individual projections.

9. The method performed by the computer in the MR apparatus of claim 8, comprising with the computer of the MR apparatus calibrating an MR apparatus based, at least in part, on the estimated gradient delay.

10. The method performed by the computer in the MR apparatus of claim 9, where calibrating the MR apparatus includes one or more of:

manipulating a pulse sequence as a function of the estimated gradient delay, with the computer of the MR apparatus; and controlling the MR apparatus with the computer in order to use the estimate of the center of k-space as a portion of a navigator signal in order to perform a retrospective self-gated magnetic resonance image acquisition.

11. A magnetic resonance (MR) trajectory correcting apparatus, comprising:

a first circuit configured to access MR trajectory data that has been affected by a gradient delay, where the gradient delay occurred in an MR apparatus that acquired the MR trajectory data, the first circuit being configured:

to control the MR apparatus in order to acquire the MR trajectory data as multi-channel non-Cartesian data, and to identify a portion of an MR trajectory described by the MR trajectory data that represents a regular portion of a projection in the MR trajectory, where identifying the regular portion comprises analyzing with a computer of the MR apparatus a projection angle associated with the MR trajectory;

a second circuit configured to compute GRAPPA Operator Gridding (GROG) weights for a portion of the MR trajectory data, where GRAPPA is a generalized auto-calibrating partially parallel acquisition technique;

a third circuit configured to compute a shift direction and a shift amount with respect to the MR trajectory data, where the shift direction and the shift amount are configured to correct the MR trajectory data, where the third circuit is configured to identify the center of k-space, by applying an iterative gradient ascent algorithm to the MR trajectory data, and where the third circuit is configured to compute the shift direction and the shift amount by comparing an initial echo-peak magnitude (EPM) computed from the MR trajectory data to an identified center of k-space; and a fourth circuit configured to manipulate the MR trajectory in order to account for the gradient delay based, at least in part, on the computed shift amount and the computed shift direction, where accounting for the gradient delay repositions a projection, associated with the MR trajectory data to pass through a desired point in k-space, where the fourth circuit is also configured to manipulate the MR trajectory by applying the computed shift amount in the computed shift direction onto the MR trajectory data in order to make the MR trajectory appear to pass through the desired point in k-space, with the desired point in k-space being the center of k-space.

* * * * *